(12) United States Patent
Bolken et al.

(10) Patent No.: US 7,156,633 B2
(45) Date of Patent: *Jan. 2, 2007

(54) APPARATUS FOR ENCAPSULATING A MULTI-CHIP SUBSTRATE ARRAY

(75) Inventors: Todd O. Bolken, Meridian, ID (US); David L. Peters, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/121,221

(22) Filed: May 3, 2005

(65) Prior Publication Data

US 2005/0189642 A1    Sep. 1, 2005

Related U.S. Application Data

(60) Continuation of application No. 10/164,086, filed on Jun. 4, 2002, now Pat. No. 6,910,874, which is a division of application No. 09/643,193, filed on Aug. 21, 2000, now Pat. No. 6,576,496.

(51) Int. Cl.
*H01L 21/56* (2006.01)
*B29C 45/14* (2006.01)

(52) U.S. Cl. .................... 425/116; 425/125; 425/129.1; 425/544

(58) Field of Classification Search ................ 425/116, 425/125, 129.1, 544; 264/272.15
See application file for complete search history.

(56) References Cited

U.S. PATENT DOCUMENTS

| | | |
|---|---|---|
| 4,332,537 A | 6/1982 | Slepcevic |
| 4,470,784 A | 9/1984 | Piotrovsky |
| 4,824,627 A | 4/1989 | Hammer et al. |
| 4,868,349 A | 9/1989 | Chia |
| 4,954,301 A | 9/1990 | Saeki et al. |
| 5,100,311 A | 3/1992 | Clemens et al. |
| 5,133,921 A | 7/1992 | Yokoyama |
| 5,254,501 A | 10/1993 | Tung et al. |
| 5,285,104 A | 2/1994 | Kondo et al. |
| 5,304,512 A | 4/1994 | Arai et al. |
| 5,489,805 A | 2/1996 | Hackitt et al. |
| 5,550,711 A | 8/1996 | Burns et al. |
| 5,609,889 A | 3/1997 | Weber |
| 5,682,673 A | 11/1997 | Fehr |
| 5,723,156 A | 3/1998 | Matumoto |

(Continued)

FOREIGN PATENT DOCUMENTS

WO    WO 9613068 A1    5/1996

*Primary Examiner*—Robert B. Davis
(74) *Attorney, Agent, or Firm*—TraskBritt

(57) ABSTRACT

A mold apparatus for encapsulating IC chips mounted on a substrate. In an exemplary embodiment a mold is provided with an upper mold platen having a plurality of cavities for encapsulating wire bonds and related interconnections on a first side of a multi-chip carrier substrate. The mold further includes a lower mold platen with a single cavity for encapsulating substantially the entire second chip side of the carrier substrate. Support elements are provided for supporting the multi-chip carrier substrate. The support elements are configured to prevent or minimize substrate deflection during the fill of the mold cavities with encapsulant material. The support elements may be integral to a mold cavity or may be removable. The support elements may further be aligned along lines representing a series of individual device packages. The molded assembly may then be cut along marks left in the encapsulant to define individual device packages.

27 Claims, 11 Drawing Sheets

U.S. PATENT DOCUMENTS

| | | |
|---|---|---|
| 5,766,972 A | 6/1998 | Takahashi et al. |
| 5,776,512 A | 7/1998 | Weber |
| 5,824,569 A | 10/1998 | Brooks et al. |
| 5,824,950 A | 10/1998 | Mosley et al. |
| 5,841,187 A | 11/1998 | Sugimoto et al. |
| 5,853,771 A | 12/1998 | Matsumoto |
| 5,898,212 A | 4/1999 | Kim |
| 5,898,575 A | 4/1999 | Hawthorne et al. |
| 5,935,502 A | 8/1999 | Ferri et al. |
| 5,998,877 A | 12/1999 | Ohuchi |
| 6,036,908 A | 3/2000 | Nishida et al. |
| 6,063,321 A | 5/2000 | Koyama et al. |
| 6,063,646 A | 5/2000 | Okuno et al. |
| 6,193,493 B1 | 2/2001 | Steijer et al. |
| 6,200,824 B1 | 3/2001 | Hashimoto |
| 6,214,645 B1 | 4/2001 | Kim |
| 6,268,644 B1 | 7/2001 | Umehara et al. |
| 6,274,405 B1 | 8/2001 | Hashimoto |
| 6,468,832 B1 | 10/2002 | Mostafazadeh |

APPARATUS FOR ENCAPSULATING A MULTI-CHIP SUBSTRATE ARRAY

CROSS-REFERENCE TO RELATED APPLICATIONS

This application is a continuation of application Ser. No. 10/164,086, filed Jun. 4, 2002, now U.S. Pat. No. 6,910,874, issued Jun. 28, 2005, which is a divisional of application Ser. No. 09/643,193, filed Aug. 21, 2000, now U.S. Pat. No. 6,576,496, issued Jun. 10, 2003.

BACKGROUND OF THE INVENTION

1. Field of the Invention

This invention relates generally to the molding and encapsulation of semiconductor devices. More particularly, the invention pertains to a method and mold apparatus for encapsulating a multi-chip substrate array.

2. State of the Art

Integrated circuit semiconductor dice, sometimes referred to as chips, are manufactured from a semiconductor material such as silicon, germanium or gallium arsenide, and contain microscopic circuits which are formed on each chip by photolithographic techniques. The "active surface" of a semiconductor die is further formed with a plurality of external connections, typically referred to as bond pads, which are designed for soldering wire bonds and thus enable the semiconductor die to be electrically interconnected to an external electrical device, substrate or apparatus.

Present methods used in the fabrication of semiconductor die packages involve the process steps of die bonding, wire bonding, molding, deflashing, and singulation. In the die bonding process, semiconductor dice are bonded or soldered to a lead frame strip, printed wiring board, or other conductive substrate by various well-known techniques usually involving a conductive adhesive. During wire bonding, conductive wires usually formed of gold or aluminum are attached, one at a time, from bond pads on the active surface of a semiconductor die to corresponding electrode pads on the conductive substrate. Following die attach and wire bonding, a mold assembly for transfer molding is typically used for component encapsulation of individual semiconductor dice mounted on the conductive substrate, including encapsulation of the wire bond interconnections formed between the semiconductor dice and conductive substrate. In the deflashing process, resin bleed formed by mold compound that may have escaped from minute gaps between the mold assembly and the conductive substrate is removed from leads or bond pads on the conductive substrate. In the singulation process, an encapsulated semiconductor die mounted on a conductive substrate containing multiple semiconductor dice is typically isolated from other encapsulated semiconductor dice by cutting or segmenting the conductive substrate such that the electronic components comprising an individual semiconductor device package are separated from other individual semiconductor device packages.

It is well known in the art that a critical step in the semiconductor device fabrication process is the encapsulation of semiconductor dice and their interconnections. The encapsulation or "sealing" of a semiconductor die and its wire bond interconnections within a "package" of plastic or other moldable material serves to protect their materials and components from physical and environmental stresses such as dust, heat, moisture, static electricity, and mechanical shocks.

In a typical encapsulation process for surface-mounted semiconductor dice, a conductive substrate strip, with mounted and wire bonded semiconductor dice placed along the length of the strip, is placed in the lower mold plate of a "split cavity" mold comprising an upper and lower member. The upper and lower members of the mold are frequently referred to as "platens" or "halves." With the upper mold platen raised, the conductive substrate strip is positioned on the lower mold platen such that the component portions to be encapsulated are in registration with multiple mold cavities formed in the lower mold platen. The mold is closed when the upper platen is lowered onto the lower platen. When the mold is closed, a peripheral portion of the conductive substrate strip is typically compressed between the upper and lower platens to seal the mold cavities in order to prevent leakage of liquefied plastic molding compound. The force required to compress the platens together is generally of the order of tons, even for molding machines having only a few mold cavities.

Depending upon the type of semiconductor die and substrate to be encapsulated, the upper platen may also contain mold cavities in registration with component portions of the conductive substrate strip to be encapsulated. In other devices, such as those having a heat sink attached to a semiconductor die, or in certain semiconductor dice having a ball grid array (BGA) or similar array on a circuit board, the molding process is conducted so that the outer surface of the heat sink or circuit board forms an exterior surface of the package which rests against a mold cavity or platen surface. With these semiconductor devices, the molding process may be conducted such that the exterior surface is free from coverage by the plastic encapsulant material.

Liquified encapsulant is fed to the cavities of the mold by "runners" (i.e., channels) that extend the length of the conductive substrate strip. The runners, in turn, are fed from a "transfer pot" or reservoir which pressurizes, heats and holds the encapsulant molding compound until delivery. In some package applications, a single runner may be sufficient to supply encapsulant to feed more than one conductive substrate strip. For larger packages, however, the consumption of greater amounts of molding compound dictates that the larger package be supplied with its own dedicated runner. Usually, constricted channels known as "gates" are located at the entrance to each mold cavity to limit the flow rate and injection velocity of liquefied encapsulant into the cavity. Gates may be located in either the top half or bottom half of the mold, or both. If a gate is located in only one half of a mold with upper and lower cavities, a conductive substrate can be designed with an aperture extending through opposing surfaces of the conductive substrate so that the encapsulant has the ability to flow from one cavity side to the other.

Typically, preheated powdered or pelletized plastic, e.g., thermosetting resin, is placed in the transfer pot and compressed by a transfer cylinder, or ram. The heated, pressurized plastic becomes liquefied and flows through the runners and gates where it eventually fills each mold cavity, thereby flowing over the semiconductor die, conductive substrate, and wire bonding areas to be encapsulated. The transfer pressures employed to push the liquefied plastic through the runners, gates and into the mold cavities typically range from 200–1200 psi. This results in relatively high velocity flows out of the gates which diminish somewhat as the plastic moves into the cavity and assumes a plug-type flow configuration. Lower transfer pressures are undesirable because of the potential for polymerization or gelling of the plastic mold compound prior to completely filling the mold cavities. After the cavities are filled, the encapsulant is maintained at a specified pressure until cure.

The molding compound is then allowed a curing period, where it subsequently hardens to encapsulate the conductive substrate and the devices attached to it. Air is expelled from each cavity through one or more runners or vents as the plastic melt fills the mold cavities. Following hardening by partial cure of the thermoset plastic, the mold plates are separated along the parting line and the encapsulated semiconductor devices are removed and trimmed of excess plastic which has solidified in the runners and gates. Additional thermal treatment may complete the curing of the plastic package. The shape of the mold cavities and the configuration of the conductive substrate determine the final shape of the semiconductor package.

The molding process is then repeated with a new batch of mounted conductive substrate strips. The molding process described herein is known in the art to be subject to automation, as well as manual operation, at each phase of the molding process.

Exemplary patents describing various apparatus and methods for encapsulating surface-mount electronic packages are described by U.S. Pat. No. 6,036,908 to Nishida, U.S. Pat. No. 5,723,156 to Matumoto, U.S. Pat. 5,609,889 to Weber, U.S. Pat. No. 5,304,512 to Arai, U.S. Pat. No. 5,254,501 to Tung et al., U.S. Pat. No. 4,954,301 to Saeki et al., and U.S. Pat. No. 4,332,537 to Slepcevic.

At the high pressures used for delivery of encapsulant, mold cavities and their gates must be carefully designed to prevent the conductive wires from dislodging or moving into contact with one another—a condition known as wire sweep. Also factored into the design of the molding apparatus are provisions for flow characteristics sufficient to meet the essential requirement of a void-free encapsulation. A related concern in mold apparatus with upper and lower mold body cavities fed by a single gate is that when liquefied plastic is transferred from the gate to the upper and lower cavities, the lower cavities tend to fill first, which can result in an upward buildup of pressure sufficient to temporarily deflect the carrier substrate during encapsulation. Upon removal from the mold plates, the residual forces from the deflection of the carrier substrate may cause cracking, spalling, etc., in the package. Controlling air bubbles is a further consideration: air bubbles potentially caused by multiple layers of wire bonding, air pockets adjacent to the semiconductor die, insufficient pressure packing, or the gasification of substrate materials due to the elevated temperatures of the transfer molding process and the like.

Several patents include disclosures which relate to solutions for conditions which cause a warping or deflection in a lead frame or other substrate during the filling of the mold cavities with liquefied encapsulant. For example, U.S. Pat. No. 4,954,301 to Saeki et al. discloses a transfer cylinder whose downward displacement is controlled by a microcomputer in order to decrease void formation and deformation of the carrier insert. U.S. Pat. No. 5,723,156 to Matumoto discloses a gate arrangement designed to transfer encapsulant equally into the upper and lower cavities of the mold.

With regard to devices having an attached heat sink, U.S. Pat. No. 5,776,512 to Weber describes a mold which has a biased plug in a lower mold cavity that exerts pressure on a heat sink in contact with an upper mold half to prevent molding compound from covering the heat sink. Weber further utilizes an extending portion of the carrier substrate to contact the lower mold platen, thus stopping the carrier substrate from deflecting from the downward push of the biased plug.

U.S. Pat. No. 5,682,673 to Fehr discloses a mold for encapsulating integrated circuit chips mounted in conventional fashion to die attach pads of lead frames. The lower mold cavity of Fehr is provided with one or more installed support pins, soldered into holes in the mold, for furnishing support under the die attach pad during injection of molding compound into upper and lower mold cavities. The support pins are provided to counteract the forces resulting from the flow of encapsulant over the chip during the filling of the upper mold cavity, and thus prevent the die attach pad from undesirably contacting the lower mold cavity. In one embodiment, Fehr discloses a single support pin located directly under the center of the die attach pad. A second embodiment of Fehr shows several support pins positioned in a rectangular array under the die attach pad of a wide-area, thin package requiring increased support. The support pins of Fehr are disclosed to preferably have tapered ends of a generally conical shape to provide a small area for contact with the die attach pad.

In recent years, there has been an increased demand for high-density mounting of semiconductor packages which has coincided with advances in the performance and functionality of integrated circuits. These demands have led to numerous innovations in semiconductor die and carrier substrate design.

One form of interconnection recently developed to meet the needs of industry is known as "board-on-chip" (BOC). In this arrangement, a semiconductor die (chip) is mounted, active side up, under a carrier substrate configured with one or more slots for accepting the conductive wires of the semiconductor die. The conductive wires of the semiconductor die extend through the slot in the carrier substrate where they are connected to wire bond pads of the carrier substrate's surface.

In order to increase throughput in the mounting and encapsulation of board-on-chip devices, semiconductor dice can be mounted in various board-on-chip matrices or arrays, e.g., three devices across a width of a lead frame strip, printed wiring board or other conductive substrate, thus maximizing the number of packages to be formed per array strip. In these types of array arrangements, it may be considered advantageous, for reasons of simplicity in die tooling, molding, and economies of scale, to utilize a mold with a semiconductor die side cavity large enough to cover the entire semiconductor die side of the substrate array with encapsulant, rather than to use individual molded bodies for encapsulating each semiconductor die.

Since array-mounting does not easily allow encapsulant to be transferred from one cavity to another by flow around the substrate, both the upper and lower mold cavities may be fed encapsulant simultaneously. The relatively large semiconductor die side mold cavity area being unsupported to allow for the flow of encapsulant under the die, the problems previously discussed concerning temporary deflection of the carrier substrate during encapsulation become particularly acute in this type of board-on-chip substrate array. If no support is provided under this area, the residual forces in the substrate resulting from the deflection may, upon cure and removal of the encapsulated package from the mold plates, cause cracking, spalling, etc., in the package. Cracking and spalling are costly defects since the package's protective abilities are compromised, and the package cannot be repaired or reworked even though an expensive semiconductor die may be inside.

Therefore, a need exists for an encapsulation method and apparatus that will allow high throughput production of reliable, high-quality semiconductor device packages from board-on-chip arrays or other conductive substrate array arrangements.

BRIEF SUMMARY OF THE INVENTION

The present invention provides a mold and method suitable for the transfer molding encapsulation of a multi-chip substrate array, and the fabrication of an encapsulated semiconductor device package, while minimizing the attendant problems of voids, wire sweep and substrate deflection during encapsulant fill.

Split or injection molds can be used to achieve encapsulation of semiconductor device packages arranged on a carrier substrate with a plurality of integrated circuit semiconductor dice affixed thereto. The molds for such encapsulation are provided with cavities in each side of each respective mold half. Under the pressure of injection molding, the carrier substrate may deflect, causing voids, cracks, spalling, etc., in the package. Although deflection of the substrate depends on many factors, including, but not limited to, mold design, the primary deflection of the carrier substrate is towards the semiconductor die side of the mold, as hereinafter described.

The present invention provides an apparatus and method of encapsulating a multi-chip substrate array using transfer molding apparatus which prevents or minimizes substrate deflection into a mold cavity during encapsulant transfer. In one embodiment, a board-on-chip array is provided in which the carrier substrate is supported or otherwise fixtured during encapsulation. In this arrangement, a plurality of semiconductor dice is mounted, active side up in an array arrangement, under a carrier substrate surface. The carrier substrate is further configured with a plurality of wire bonding apertures for accepting the conductive wires of each semiconductor die. The conductive wires of each semiconductor die extend through the aperture in the carrier substrate where they are connected to wire bond pads on the carrier substrate surface. The wire bond pads on the carrier substrate surface may further be electrically connected to other conductors on the carrier substrate surface in the form of circuit traces, solder ball contact pads, and solder balls, etc. In a preferred embodiment, connective components of the conductors are arranged in a ball grid array of a preselected configuration around each aperture of the carrier substrate, the ball grid array allowing for electrical communication of the semiconductor die with external components. The carrier substrate may also be provided with alignment rails for automated transfer operations and easy mounting within the mold. The board-on-chip array is then placed in a mold assembly with a plurality of first mold cavities configured for encapsulating the electrical interconnections on the first side of the substrate, and a second mold cavity for encapsulating substantially the entire second side of the substrate, to include the plurality of array-mounted semiconductor dice.

In this aspect of the invention, substrate support elements, in the form of standoff pins or bosses, are provided for supporting the carrier substrate of the board-on-chip array during the encapsulation process. The standoff pins or bosses are configured to contact, or nearly contact, the die side area of the carrier substrate to prevent or minimize substrate deflection during the fill of the mold cavities with encapsulant material. Upon cure of the encapsulant, the carrier substrate is removed from the mold, and individual board-on-chip packages may be obtained upon segmenting the carrier substrate array.

Preferably, the standoff pins or bosses are used in a mold cavity to support the semiconductor die side of the carrier substrate. These support elements may be aligned, or non-aligned, along lines representing one or more edge areas of individual board-on-chip packages. Individual chip packages may be obtained by sawing along imaginary lines extending through indentations found in the semiconductor die side of the encapsulated array, the indentations left by the aligned standoff pins or bosses during the process of substrate support. The standoff pins or bosses may be integral to the mold cavity, or may be removable. Integral standoff pins or bosses may be machined, cast, or otherwise fabricated into one or both sides of the mold. In one embodiment, the standoff pins or bosses may be resiliently mounted to a mold cavity surface to bias a substrate array against deflection during a molding process. The standoff pins or bosses preferably have elongated portions which extend outwardly from the mold cavity, and the elongated portions are preferably tapered in nature. As removable elements, the standoff pins or bosses may be incorporated into the encapsulant material of the package, once cured. The removable standoff pins or bosses may also be interlinked, and may be formed of the same, or a similar, material to that of the encapsulant.

The invention thus provides a mold and process which may be reliably used for mass production of encapsulated semiconductor packages, and which may be used in a manual or automated fashion. In one embodiment, the semiconductor packages formed by the methods of the present invention can be used to construct a semiconductor device assembly, such as a multi-chip module or a series of stacked BGA packages.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
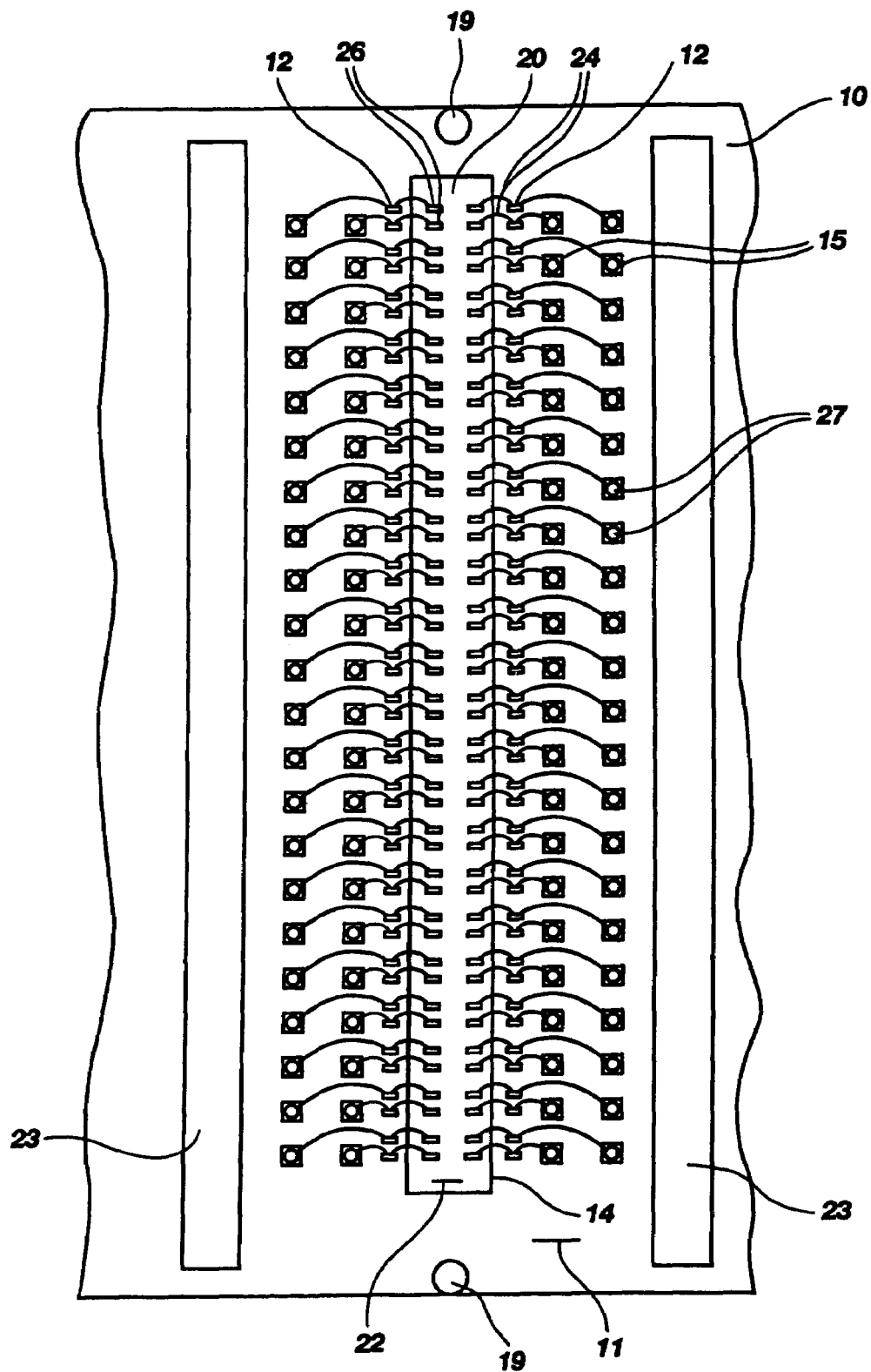
FIG. 1A illustrates a top view of an exemplary board-on-chip BGA arrangement.

Although it has many applications in semiconductor die packaging, the present invention may best be described in relation to the encapsulation of a board-on-chip array. In a board-on-chip arrangement, as is shown in drawing FIGS. 1A and 1B, a carrier substrate 10, such as a lead frame strip, wiring board or circuit board, etc., with an array of conductors and bond pads 12, is provided and typically configured with one or more slots or apertures 14 for accepting the conductive wires 24 of a semiconductor die 20. To arrive at a board-on-chip configuration, a semiconductor die 20 is placed below each aperture 14 in a die attach or die receiving area of carrier substrate 10 so as to be mounted "underneath" the carrier substrate 10 with the semiconductor die's active surface 22 facing the carrier substrate 10. Bond pads 26 of semiconductor die 20 are then connected to bond pads 12 of the carrier substrate 10 by conductive wires 24, the conductive wires 24 extending through the aperture 14 in the carrier substrate 10 to bond pads 12 on the upper surface 11 of the substrate 10. The wire bond pads 12 around each aperture 14 of carrier substrate 10 are in turn electrically connected to circuit traces (not shown) extending away from aperture 14. The circuit traces of the board-on-chip array are typically configured to end in contact pads 15, which are intermediately positioned with respect to aperture 14 and the edges of carrier substrate 10. The intermediately positioned contact pads 15 can be located on one or both sides of aperture 14. Preferably, contact pads 15 are disposed adjacent aperture 14 and on both sides of aperture 14. Also shown are elongated separation openings 23 which may optionally be provided to facilitate singulation of the carrier substrate 10 into separate BGA packages. The carrier substrate 10 may also be configured with guide holes 19 for handling and positioning the carrier substrate 10 during automated manufacturing processes.

As further shown by drawing FIG. 1A, contact pads 15 of the carrier substrate 10 are preferably configured for a ball grid array (BGA), fine ball grid array (FBGA) or the like. As used herein, the term "BGA" refers to BGA, FBGA, and BGAs of various smaller pitches. The particular BGA arrangement represented in drawing FIG. 1A is an 88 solder ball FBGA which is arranged in two rows on either side of the aperture 14, the solder balls having a pitch of 0.8 μm or less. It is understood that the BGA for use in the present invention is not limited to any particular number of solder balls, pitch or configuration. Rather, any number of preselected configurations, pitches and solder balls may be used. Placed on contact pads 15 of carrier substrate 10 is a plurality of solder balls 27 attached thereto in a dense grid pattern. The solder balls 27 are arranged to be received by an external component (e.g., a circuit board, a second BGA semiconductor package, a multi-chip module board, etc.) having matching or complementary electrical contacts. This dense grid arrangement serves to provide an individual device package with electrical communication capability with external components and forms the basis for the high interconnect density of the BGA package.

Figure 1B:
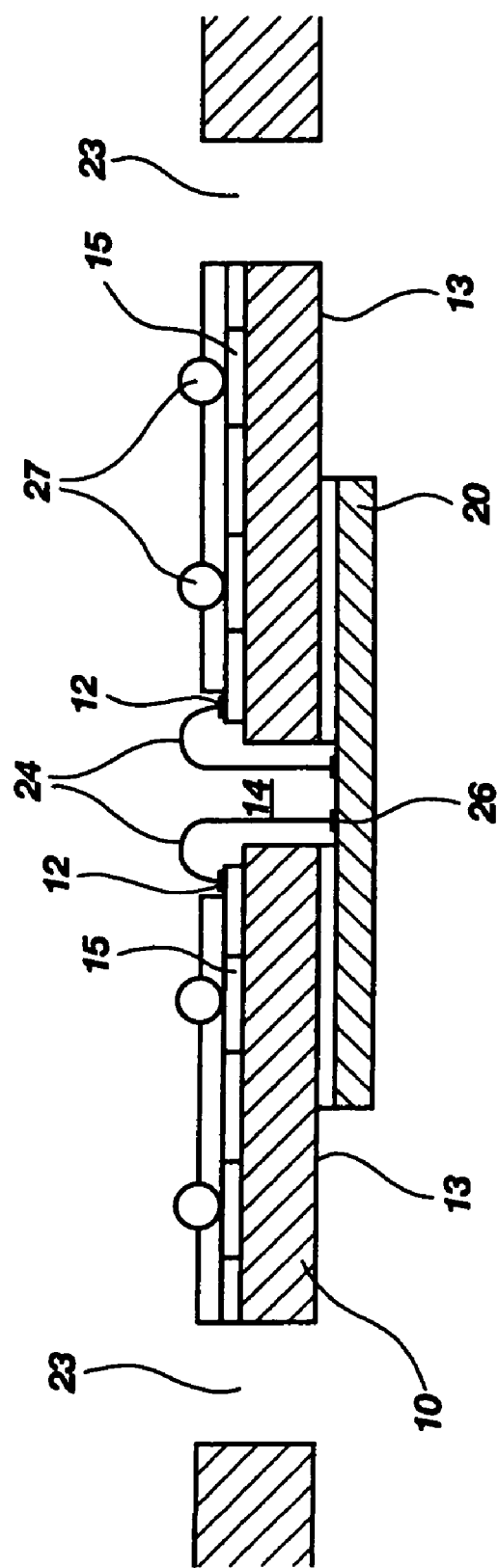
FIG. 1B shows a schematic cross-sectional view of an exemplary board-on-chip BGA arrangement.

The board-on-chip BGA arrangement of drawing FIGS. 1A and 1B includes integrated semiconductor die 20 affixed underneath a dielectric carrier substrate 10. As previously described, carrier substrate 10 includes a plurality of conductive traces, the traces typically formed of a metal and underlying a thin solder mask layer disposed on the upper surface 11 of the carrier substrate 10. The conductive traces may be connected to solder balls 27 and contact pads 15 by way of vias (not shown) routed through or around the carrier substrate 10. The conductive traces are typically subsequently formed for connection with bond pads 12, which, in turn, are electrically connected to conductive wires 24 extending through aperture 14, the conductive wires 24 connected at the other end to bond pads 26 on an active surface 22 of an integrated semiconductor die 20.

During the molding process as described herein, a liquefied plastic material is molded over the semiconductor dice on one side of carrier substrate 10, and over the electrical interconnections of the semiconductor dice and carrier substrate 10 on the other side of carrier substrate 10, the encapsulation serving to protect the semiconductor dice and related interconnections from the outside environment. In addition to the plurality of semiconductor dice 20 attached to an underside surface of carrier substrate 10 (hereinafter referred to as die side area 13), other devices such as resistors, capacitors, etc., may be mounted to either side of the substrate and incorporated into the circuitry.

Figure 2:
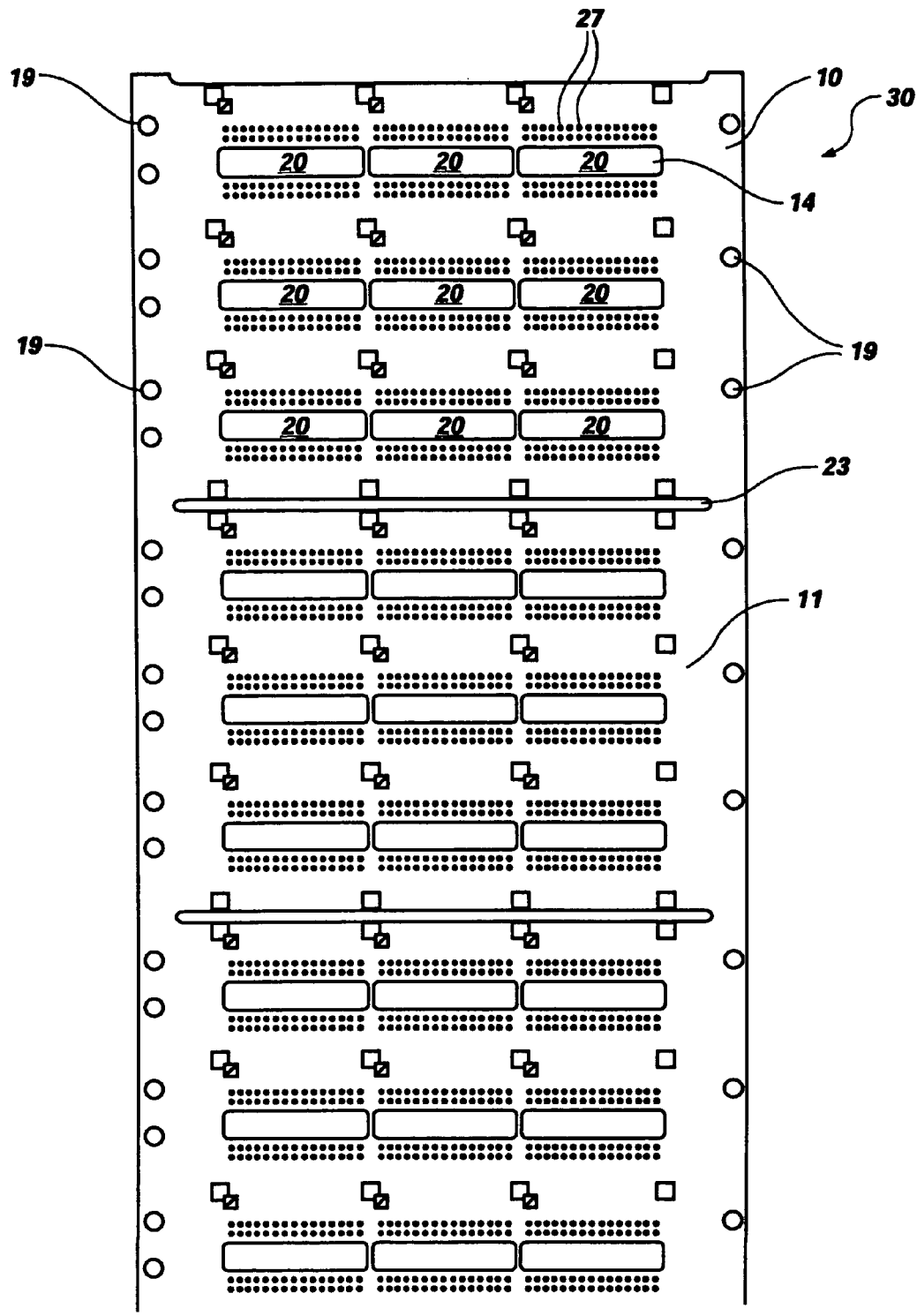
FIG. 2 is a carrier substrate array arrangement comprising a 60 ball FBGA with an array of nine devices placed three across a width of a carrier substrate strip.
Figure 3:
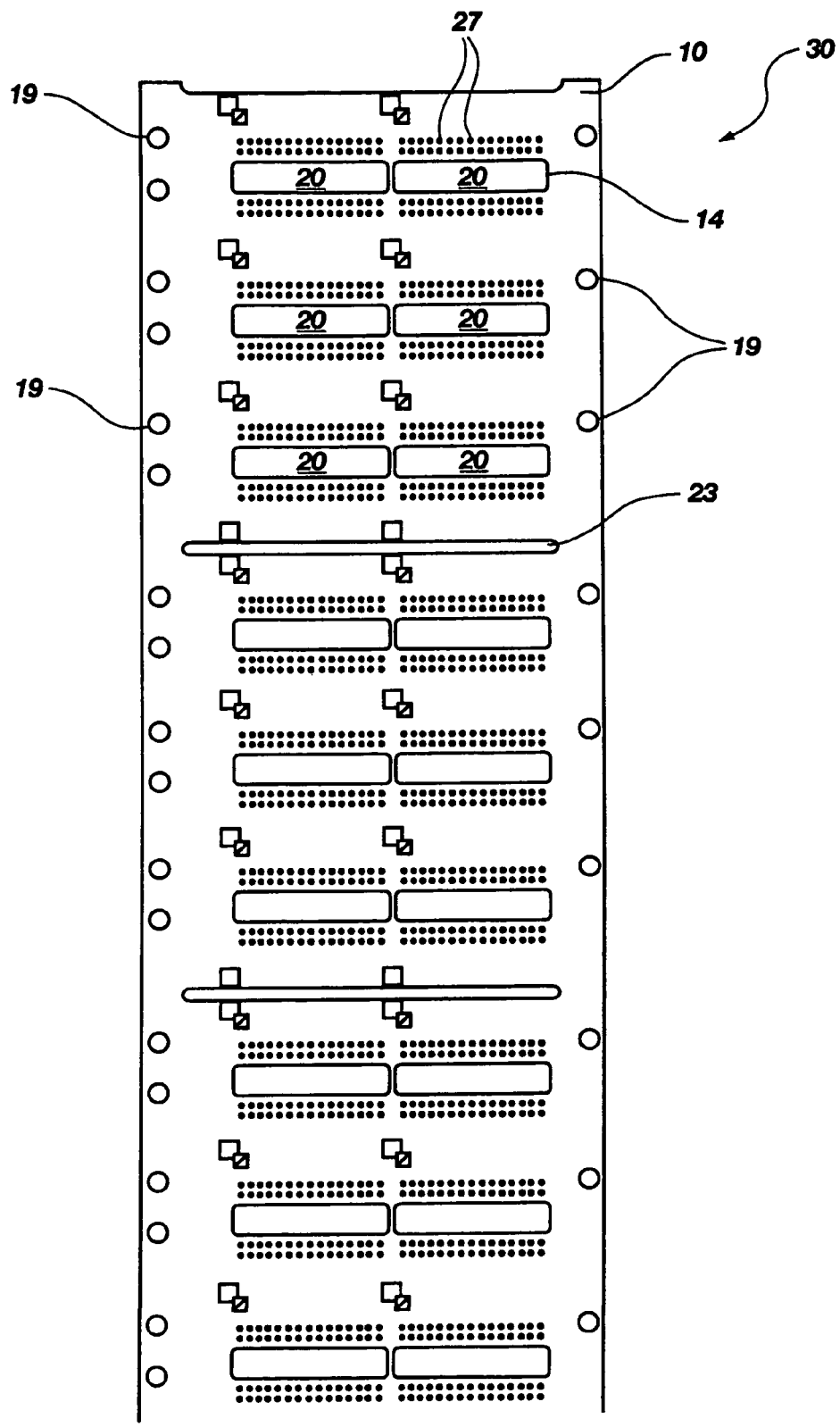
FIG. 3 is a carrier substrate array arrangement comprising a 60 ball FBGA with an array of six devices placed two across a width of a carrier substrate strip.

In order to increase throughput in the mounting and encapsulation of board-on-chip devices, the semiconductor dice 20 to be encapsulated are mounted in various matrices or carrier substrate arrays 30 (see FIGS. 2 and 3). Carrier substrate arrays 30 preferably comprise two or more devices placed across a width of a lead frame strip or other carrier substrate 10, thus maximizing the number of packages to be encapsulated per carrier substrate 10. One such carrier substrate array 30, in this case comprising an array of nine semiconductor dice 20 placed three across a width of a carrier substrate 10 portion, is shown in drawing FIG. 2. The carrier substrate 10 may be formed of a plastic laminate or of other suitable materials known in the art. Carrier substrate 10 is preferably provided with guide holes 19 for use in automated transfer processes, such as die attach, and for alignment in mounting the carrier substrate 10 within an encapsulation mold.

Although drawing FIG. 2 shows a 60 ball FBGA surrounding the apertures 14 over each of the nine semiconductor dice mounting areas on carrier substrate array 30, carrier substrate 10 may or may not be configured with a plurality of ball grid arrays on its upper surface 11. It is understood, however, that the method and apparatus of the present invention is suitable for the encapsulation of a carrier substrate array 30 with any number of board-on-chip devices or board-on-chip devices in combination with other types of semiconductor dice using various types of interconnections and mounting arrangements. It is further understood that the present invention relates to the encapsulation of any number of semiconductor dice, and/or their related electrical interconnections, which are configured in an array arrangement. Thus, the present methods have applicability to semiconductor die arrays configured in a manner other than board-on-chip, such as arrays of flip-chips or other surface-mounted semiconductor die types. It is additionally contemplated that the arrays of semiconductor dice and/or electrical interconnections to be encapsulated by the methods of the present invention can be organized in a multitude of various configurations to suit particular manufacturer or end user applications.

For example, as shown in drawing FIG. 3, a carrier substrate array 30 to be subjected to encapsulation by the method and apparatus of the present invention can be configured such that semiconductor dice 20 are arranged in a board-on-chip array of six semiconductor dice 20 with pairs of two semiconductor dice 20 positioned across a width of a carrier substrate 10 portion. Additionally, one or more semiconductor dice 20 may have a capacitor, heat sink or second device attached to its back side. These and other array and semiconductor dice arrangements contemplated by the present invention will be more apparent after the description of the mold apparatus embodiments below.

Figure 4:
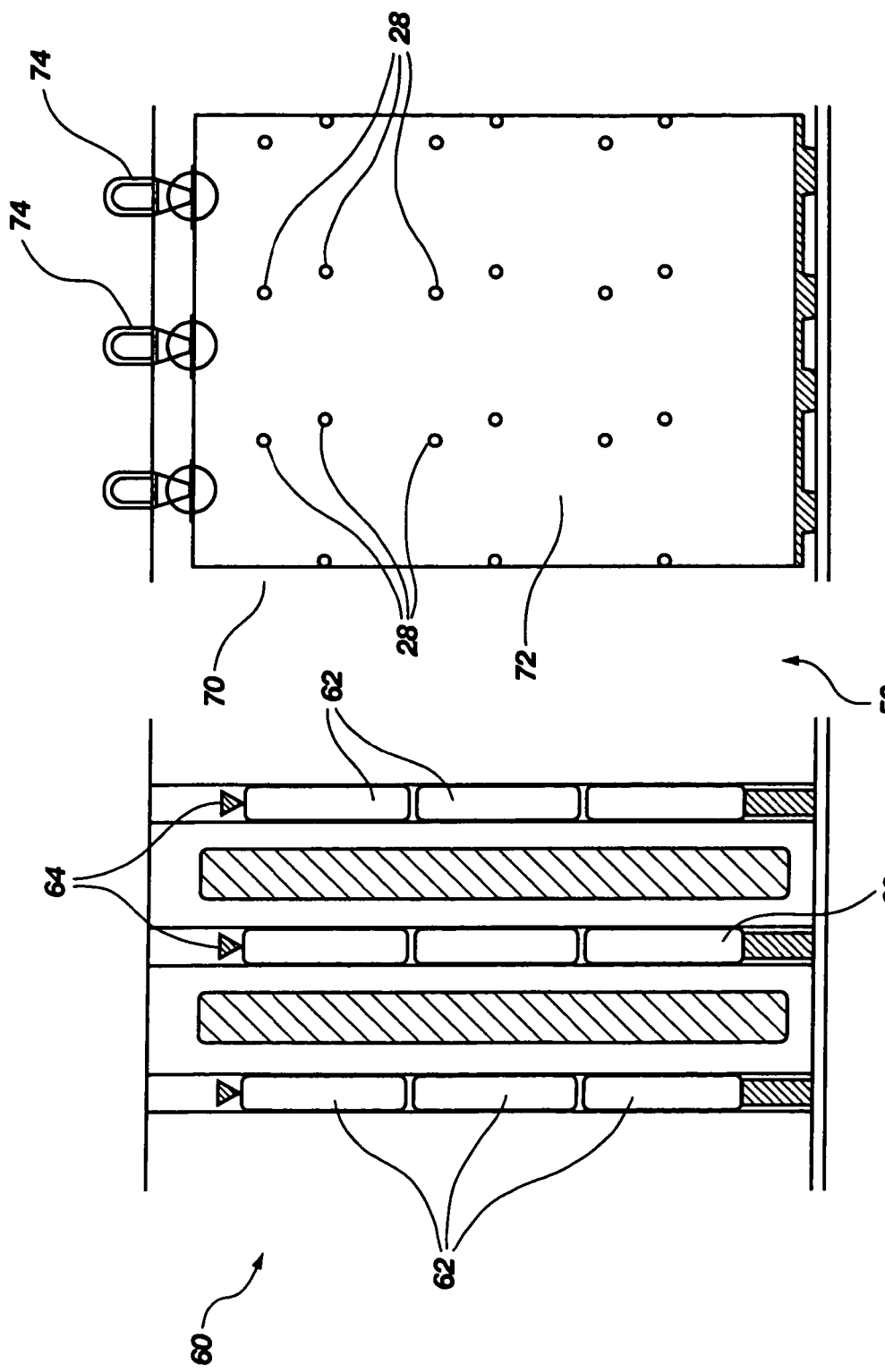
FIG. 4 illustrates an embodiment of a mold apparatus of the present invention configured for encapsulating a board-on-chip array.

In drawing FIG. 4, an embodiment of a mold apparatus 50 of the present invention for encapsulating board-on-chip arrays is provided with a first mold platen 60, a second opposing mold platen 70, and a transfer pot and plunger (not shown) for injecting molten encapsulant into the mold cavities. The first mold platen 60 comprises a plurality of first mold cavities 62 suitable for encapsulating an array of wire bond interconnections resulting, for example, from previously wire bonded conductive wires 24 extending from bond pads 26 on the active surfaces 22 of a plurality of semiconductor dice 20, through apertures 14 and to bond pads 12 of carrier substrate 10 (see drawing FIG. 1). Each first mold cavity 62 corresponds to a single wire bond interconnection area of semiconductor die 20 and carrier substrate 10. Portions of first mold platen 60 around each of first mold cavities 62 are configured, upon the closing of the mold apparatus 50, to provide a sufficient clamping force adjacent each of the wire bonding interconnection areas to be encapsulated so as to prevent unwanted encapsulant and/or resin bleed from contacting areas exterior to first mold cavities 62 of first mold platen 60, the result of which could contaminate external electrical component interconnection areas such as the BGA area of carrier substrate 10. To further prevent encapsulant from contacting areas outside of first mold cavities 62, various dam bars known in the art (not shown) may be suitably positioned on carrier substrate 10 around the wire bond interconnection areas to be encapsulated. The first mold platen 60 may also comprise an area (not shown) for positioning and supporting the perimeter regions of carrier substrate 10.

The first mold platen 60 typically includes one or more passages or runners (not shown) for the entry of liquid molding compound through one or more gates 64 into each of first mold cavities 62, and one or more additional runners or vents (not shown) connecting to each of first mold cavities 62 to allow for the removal of air displaced when liquid encapsulant is forced into first mold cavities 62. Preferably, one or more gates 64 allowing for the flow of liquid encapsulant into each of first mold cavities 62 are typically located in end portions of each first mold cavity 62, but may be located in a myriad of positions, dependent upon the desired flow characteristics for the particular application.

With further reference to drawing FIG. 4, and with particular reference to the embodiment for encapsulating board-on-chip array arrangements as previously described, the second opposing mold platen 70 comprises an area (not shown) for positioning and supporting the perimeter regions of carrier substrate 10, and an open die side cavity 72 large enough to ensure coverage, by encapsulant, of all or most of the entire die side area 13 of the carrier substrate 10, including coverage of each individual semiconductor die 20. Thus, rather than using individual molded bodies for encapsulating each semiconductor die 20 in the carrier substrate array 30, the clearances provided by relatively large die side cavity 72 will result in flowed encapsulant at least substantially covering a continuous die side area 13 of carrier substrate 10. Preferably, the depth of the mold is such that, while allowing clearance under each mounted die for the flow of encapsulant material, the encapsulant material over the dice adds only a minimal additional thickness to carrier substrate 10. Semiconductor dice having a low profile are preferably used in the carrier substrate array 30; thus, the die side cavity 72 is configured to a preselected depth which will minimize any increase in semiconductor die profile.

Regarding the area for positioning and supporting the perimeter regions of carrier substrate 10, the second opposing mold platen 70 may comprise a seating area for the positioning of carrier substrate 10 which corresponds to an alignment feature of carrier substrate 10, such as guide holes 19 (see drawing FIG. 1), thus allowing for easy positioning of carrier substrate 10 within the second opposing mold platen 70.

The advantages gained from the above-described cavity design for the opposing second mold platen include, among other things, simplicity in die tooling, molding, and economies of scale. Similar to first mold platen 60, second opposing mold platen 70 is configured with one or more runners (not shown) for delivery of encapsulant to one or more gates 74 of die side cavity 72. Since the die side cavity 72 is much larger than first mold cavity 62, a plurality of gates 74 is typically used to ensure proper, complete, controlled, and even filling of liquid encapsulant within die side cavity 72. Gates 74 may be positioned at more than one side edge area of die side cavity 72. Gates 74 may preferably be of a substantially larger diameter than gates 64 of first mold cavity 62 to allow for faster filling of die side cavity 72.

With reference to drawing FIGS. 1A, 1B, 2 and 4, protective encapsulation of board-on-chip components therefore takes place by flowing encapsulant on both sides of the carrier substrate 10. During encapsulation, conductive wires 24, wire bonds on contact pads 12 and bond pads 26, or related substrate/semiconductor die interconnections, are encapsulated on a first side of carrier substrate 10, while all or most of the die side area 13 of carrier substrate 10, including the exposed surfaces of semiconductor dice 20, is encapsulated on a second side of carrier substrate 10. The complete or nearly complete encapsulation of die side area 13 provides obvious advantages in the more complete protection of individual semiconductor die 20, as well as an increased ability to transfer heat away from the semiconductor die when heat conductive encapsulants are employed.

The relatively large die side area 13 of carrier substrate 10 being unsupported to allow for the flow of encapsulant under and around the semiconductor die 20, the problems previously discussed concerning temporary deflection of the carrier substrate during encapsulation become particularly acute in this type of board-on-chip/carrier substrate array. As each of the first mold cavities 62 and the die side cavity 72 begin to fill, the pressures exerted from the combination of flowing encapsulant and gravity in the first mold cavities, as well as possible distortions in the carrier substrate created before and/or upon the closing of the mold, may be sufficient to cause the die side area 13 of the carrier substrate 10 to bow or deflect in a downward manner. If no support is provided under this area, the residual forces in the substrate resulting from the deflection may, upon cure and removal of the encapsulated package from the mold plates, cause cracking, spalling, etc., in the package.

To reduce or forestall the possibility of cracking or spalling, the method and apparatus of the present invention provide for the die side cavity 72 of the second mold half to be configured with an irregular surface comprising a plurality of support elements, represented by standoff pins or bosses 28 as can be seen in drawing FIG. 4, that support the die side of carrier substrate 10 during the molding process. Preferably, standoff pins or bosses 28 have elongated, upwardly extending portions, and are provided as integral constituent parts protruding from die side cavity 72. As such, standoff pins or bosses 28 can be the result of a machining, casting or other suitable process in the fabrication of the die side cavity 72. Standoff pins or bosses 28 may also be formed of pins made of a suitably supportive material, such as a metal, which are coupled or otherwise affixed to a surface of die side cavity 72. For example, coupling may comprise inserting standoff pins or bosses 28 into holes fashioned into die side cavity 72, the holes preferably of slightly larger diameter than the pins. Such pins can be engaged in their respective holes by various means well-known in the art, such as by silver-soldering, brazing, or welding.

Standoff pins or bosses 28 may also be provided as spring-loaded or otherwise springably mounted within die side cavity 72 so as to exert a bias against the die side area 13 of carrier substrate 10 when the mold is closed, or to bias the die side area 13 of carrier substrate 10 when a certain degree of substrate deflection is realized during the molding process. When springably mounted, standoff pins or bosses 28 will typically slidably move within their respective holes fashioned in die side cavity 72. Thus, care must be taken to ensure a proper seal for springably mounted standoff pins or bosses 28 at the point of coupling within die side cavity 72, particularly for situations where high pressures may be realized during the fill of die side cavity 72 with liquefied encapsulant. Springably mounted standoff pins or bosses 28 may be particularly advantageous for use in accommodating carrier substrates 10 of varying thicknesses.

Figure 5A:
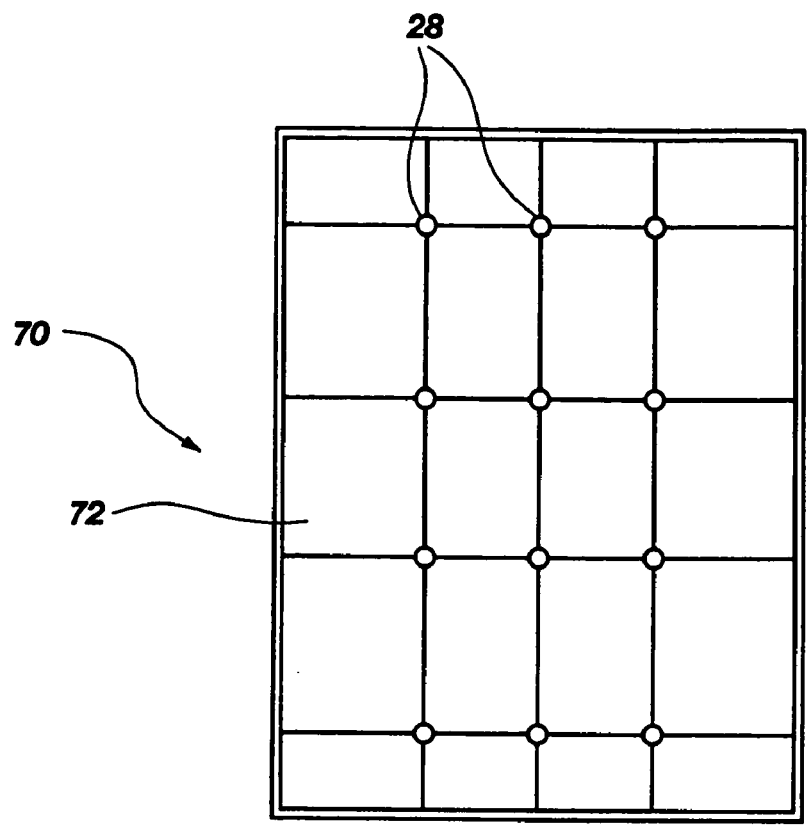
FIG. 5A illustrates the use of support elements as interlinked components within a semiconductor die side cavity of a mold for encapsulating a carrier substrate array.

Standoff pins or bosses 28 may further be elongated and upwardly extending components which are free standing or interlinked, and which are temporarily positioned within die side cavity 72. As such, the removable standoff pins or bosses 28 may be formed of a suitably resilient material that can be absorbed into, and/or become part of, the encapsulated die side area 13 of carrier substrate 10 once molding has been completed. As is shown in drawing FIG. 5A, interlinked standoff pins or bosses 28 can be arranged in a substrate-supporting template or matrix adapted to conform to the inside of die side cavity 72. Preferably, interlinked standoff pins or bosses 28 are interconnected by thin strands of a resilient material and rest in a bottom surface area of die side cavity 72. Alternatively, the interlinked standoff pins or bosses 28 may be formed as protrusions extending from a thin sheet of a resilient material that rests in die side cavity 72. Preferably, the material used for interlinking the standoff pins or bosses 28 is configured to be compatible for integration with the material used for encapsulation of the die side area 13 of carrier substrate 10. By use of the term "interlinked," it is understood that a plurality of support element components is commonly joined to a single frame or matrix.

In one aspect of the present invention, the removable standoff pins or bosses 28 are formed of the same polymer as the encapsulant. Standoff pins or bosses 28 may also be formed of materials substantially similar to that of the encapsulant. For example, each of standoff pins and bosses 28 and the encapsulant may be formed of related epoxy resins. To engage standoff pins or bosses 28 within the cured encapsulant, the proximal end or tip portions of standoff pins or bosses 28 may be configured as flattened areas of a radius larger than the elongated portion of standoff pins or bosses 28. The proximal end or tip portions of standoff pins or bosses 28 may also be formed in other suitable configurations which will secure, retain, or otherwise anchor standoff pins or bosses within the encapsulant while flowing and/or once the encapsulant has cured. When standoff pins or bosses 28 have been incorporated into the encapsulant, the otherwise planar and regular encapsulated die side surface of carrier substrate 10 may be made irregular as a result of an exposed surface area of standoff pins or bosses 28. As used herein, the term "irregular" refers to the lack of a contiguously uniform exterior surface area. Thus, an "irregular surface" may refer to an exposed surface area with a protrusion, indentation, or other asymmetric feature thereon. Similarly, an "irregular feature," as used herein, may be formed as a protrusion, indentation, or other asymmetrical aspect of an otherwise uniform surface. Flow pressures of encapsulant within the mold must be tailored for the particular free-standing or interlinked embodiments used. These embodiments, comprising removable standoff pins or bosses 28, are advantageous in that they afford a relatively inexpensive and quick way to provide substrate support while lessening concerns relating to the inspection and maintenance of integrally configured or coupled standoff pins or bosses 28.

As an alternate embodiment, standoff pins or bosses 28 may be formed as suitably resilient protrusions which extend from the die side area 13 of carrier substrate 10. In a further aspect of the invention, a combination of integral and carrier substrate die side protrusions may be used.

Preferably, standoff pins or bosses 28 are positioned along what will become one or more singulated edges of each individual board-on-chip package. In this respect, standoff pins or bosses can be aligned with one or more elongated separation openings 23 which facilitate singulation of a carrier substrate (see drawing FIG. 1). It is understood, however, that standoff pins or bosses 28 can be arranged in a multitude of support-providing configurations for the carrier substrate array 30, to include contact with one or more semiconductor die 20. The optimal positioning of standoff pins or bosses 28 is thus dependent upon a variety of factors, including the particular carrier substrate array configuration, the pressures and forces exerted within the mold cavities, as well as the future applications of individual or multiple device packages.

Figure 5B:
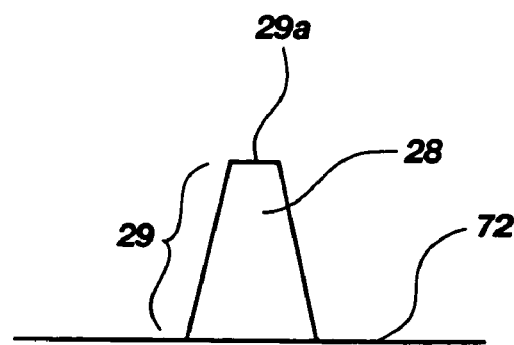
FIG. 5B illustrates a preferred configuration for the support elements of the present invention.

As seen in drawing FIG. 5B, standoff pins or bosses 28 are preferably configured to have elongated portion 29 outwardly extending from die side cavity 72. Preferably, the elongated portion 29 has been formed in a tapered fashion and with a flat or substantially flat proximal tip portion or end 29a. Standoff pins or bosses 28 may also have elongated portions 29 which are columnar or pillar form in shape, and may include a variety of proximal tip portions 29a, including proximal tip portions 29a which are generally rounded in shape. Preferably, the diameter and proximal end portions 29a of each standoff pin or boss 28 are formed so as to minimize exposure of the standoff pins or bosses 28 at the point of contact with carrier substrate 10 to protect the integrity of the package. Therefore, the uppermost surface of the contact region of the standoff pins or bosses 28, while support providing, is generally designed to be of a very small area. The tapered nature of standoff pins or bosses 28 additionally aids in the release of mold compound when the carrier substrate array 30 is removed from the mold apparatus 50. Typically, standoff pins or bosses 28 are provided of a height such that they will be in contact, or nearly in contact, with carrier substrate 10 when carrier substrate 10 is placed in opposing second mold platen 70.

The mold design of the present invention is suitable for use in transfer molding, injection molding, and other molding processes known in the art. With reference to drawing FIG. 4, once the mold apparatus 50 is closed with carrier substrate 10 in place, liquid encapsulant is flowed or injected through the runners and gates (not shown), and into the mold cavities of the mold halves to fill the mold cavities with encapsulant. As the encapsulant flows into the first mold cavities 62, standoff pins or bosses 28 provided in die side cavity 72 provide support for carrier substrate 10 to prevent or minimize any resulting deflection in carrier substrate 10 towards die side cavity 72. Vents (not shown) in both cavities bleed off displaced air to inhibit the formation of voids in the encapsulant. Once the mold cavities are filled, the liquid molding compound is allowed to cure. Upon cure, carrier substrate 10 is removed from the mold.

Preferably, the molding compound selected for use is a thermoset polymer in which thermoset chains crosslink during the cure reaction (set off by heat, catalyst, or both) and "set" into a final rigid form. Further desirable characteristics of the molding compound are a low capacity for resin bleed, and an increased capacity for heat transfer. One such exemplary molding compound is epoxy novolac.

Figure 6A:
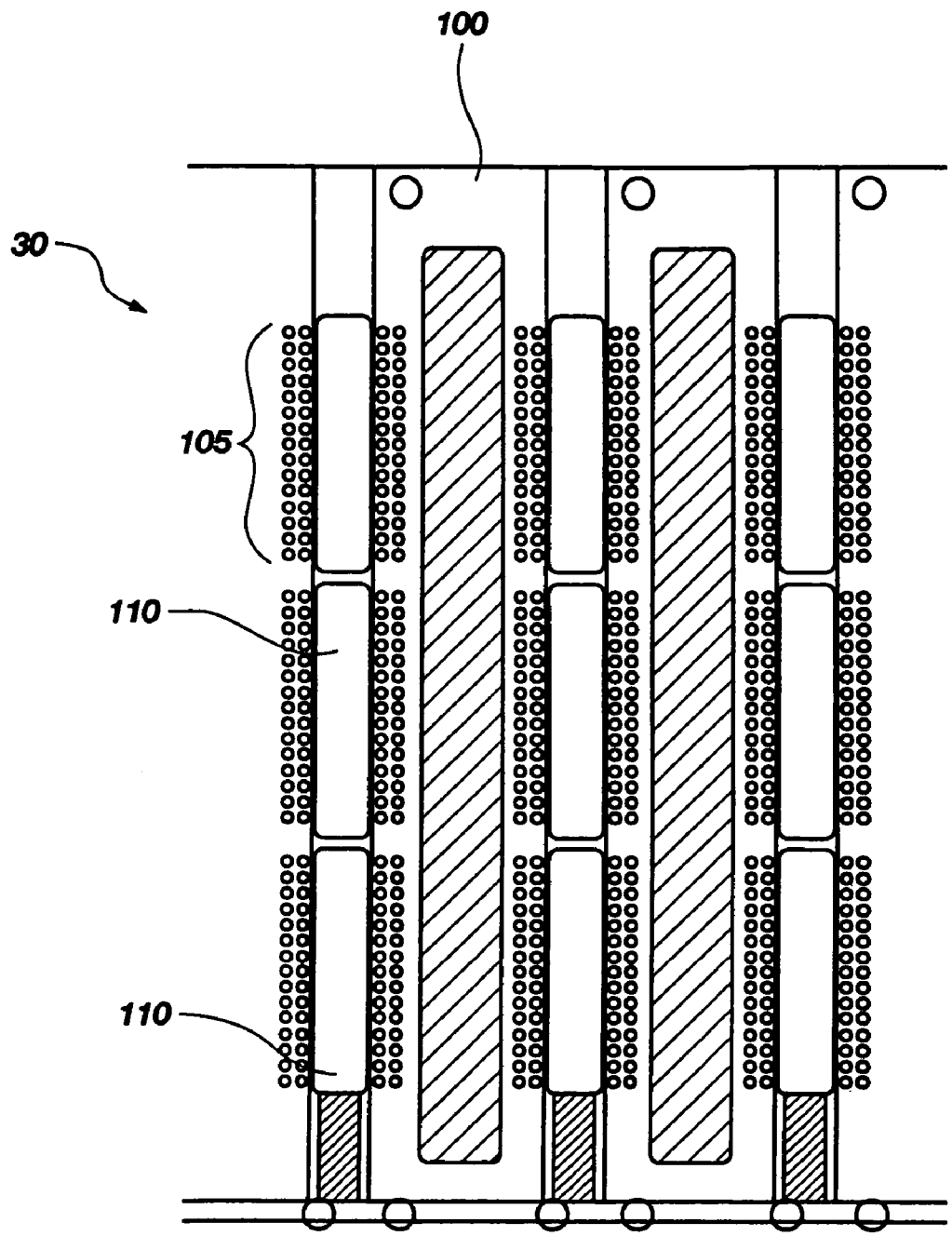
FIG. 6A shows individual molded bodies comprising encapsulated wire bond interconnections of a board-on-chip BGA array.
Figure 6B:
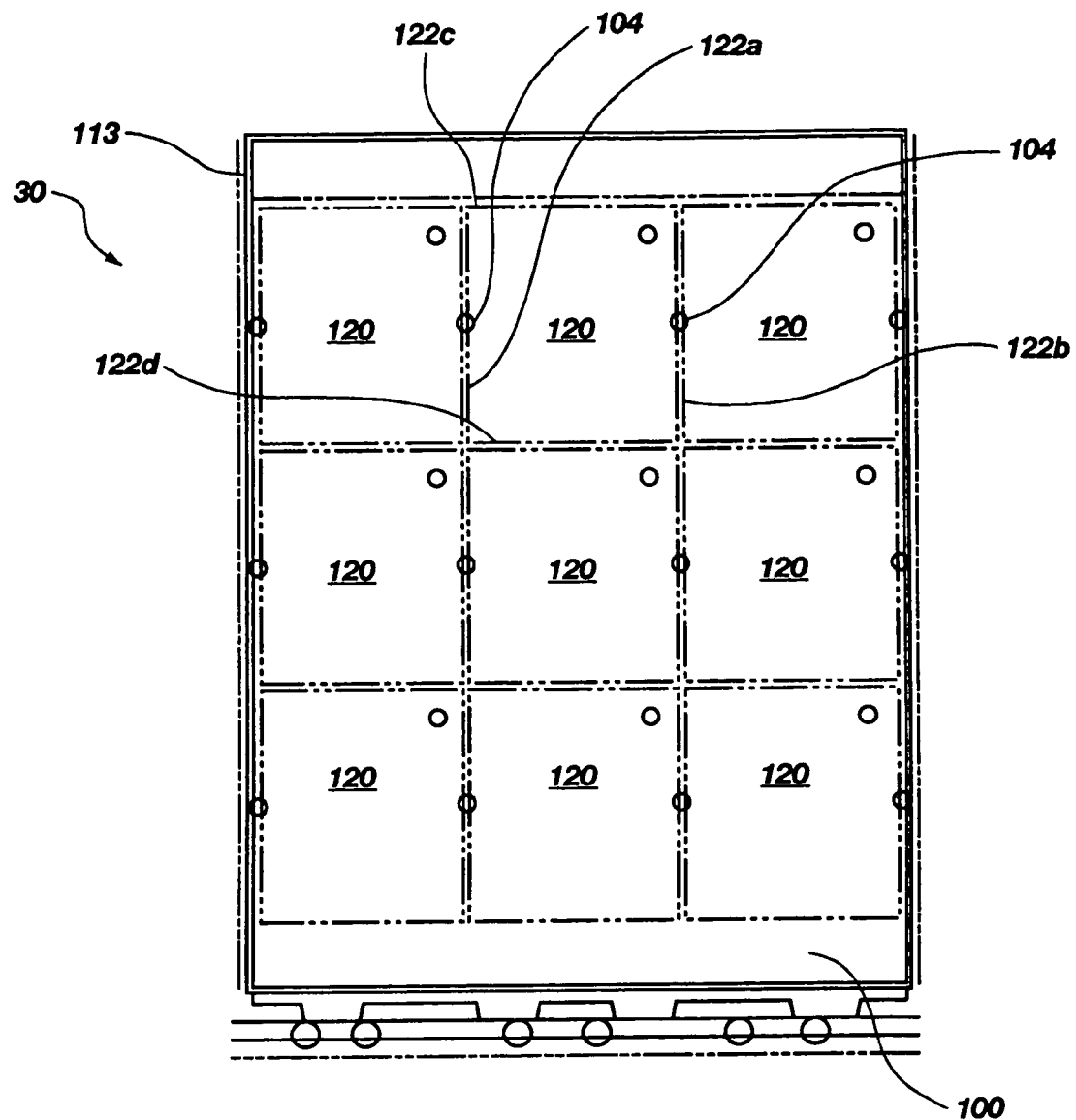
FIG. 6B illustrates an encapsulated semiconductor die side area of a board-on-chip array with indentations formed in the encapsulant by support elements.

Illustrated in drawing FIGS. 6A and 6B is an exemplary front side and back side of a board-on-chip carrier substrate array 30, as was represented in drawing FIG. 2, which has been subjected to the molding process of the present invention. The particular board-on-chip array illustrated is representative of an encapsulated array of nine board-on-chip BGA devices placed three across a width of a carrier substrate. In drawing FIG. 6A, individual molded bodies 110, comprising encapsulated wire bond interconnections of a board-on-chip BGA array, are shown on a carrier substrate 100. Individual molded bodies 110 have defined edges corresponding to the contour of first mold cavities 62 (see drawing FIG. 4). A 60 ball BGA 105 for external electrical interconnections (e.g., to a circuit board, a second BGA semiconductor package, a multi-chip module board, etc.) is shown adjacent each individual molded body 110. In the event encapsulation compound was to inadvertently flow onto BGA 105 or other undesired areas of carrier substrate 100, the excess molding compound may be removed by suitable deflashing processes known in the art.

As illustrated in drawing FIG. 6B, the entire die side area 113 of the board-on-chip array 30 is shown covered with a continuous layer of encapsulant, the encapsulant covering the die side area 113 of carrier substrate 100, to include each of the nine semiconductor dice forming the board-on-chip array 30. As a result of the substrate support provided by standoff pins or bosses 28, an "irregular surface" of slight pockets or indentations 104 may be left in the encapsulated die side area 113. Each pocket or indentation 104 corresponds to an impression left in the cured, hardened encapsulant by a proximal end portion of a standoff pin or boss 28 during the molding and cure process involving the liquefied molding compound. The particular location of pockets or indentations 104 shown are the result of the standoff pins and bosses 28 being preferably arranged in positions which correspond to one or more perimeter edges of individual board-on-chip packages 120 where singulation of carrier substrate 100 will subsequently take place. In one embodiment, standoff pins or bosses are aligned with one or more elongated separation openings 23 in a carrier substrate (see drawing FIG. 1). The outline of individual board-on-chip packages 120 through the encapsulant can be seen in schematic form in drawing FIG. 6B as represented by imaginary lines 122a, 122b, 122c, and 122d (collectively referred to as lines 122).

According to an embodiment related to the above described encapsulation process, individual and/or multiple device board-on-chip packages 120 are obtained or defined upon sawing, cutting or otherwise separating predetermined numbers of the individual packages 120 from carrier substrate 100. As previously described, the sawing, cutting or otherwise separating predetermined numbers of the individual packages 120 from carrier substrate 100 preferably comprises segmenting carrier substrate 100 along imaginary lines 122 that run through pockets or indentations 104, wherein standoff pins or bosses 28 have been aligned along package edges (also referred to as "aligned standoff pins or bosses 28"). In the embodiment where standoff pins or bosses 28 have been aligned with the elongated separation openings 23 as seen in drawing FIG. 1, one or more of the imaginary lines 122 for singulation may correspond to the elongated separation openings 23.

Figure 7:
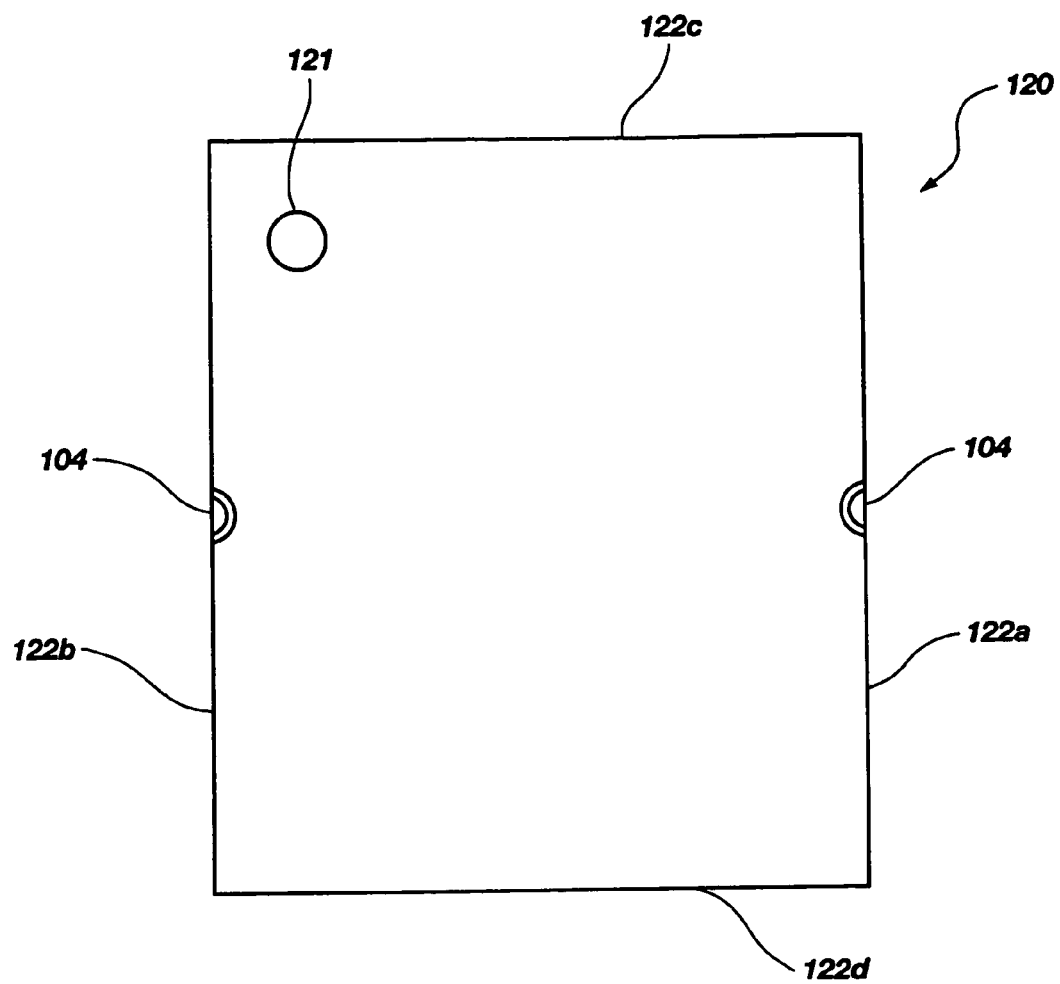
FIG. 7 is a semiconductor die side view of a singulated board-on-chip package.

A die side view of a singulated individual board-on-chip package 120 is shown in drawing FIG. 7. As shown in this embodiment, pockets or indentations 104 were formed along imaginary lines 122a and 122b representing opposing edges of an individual board-on-chip package 120, the pockets or indentations 104 resulting from the use of aligned standoff pins or bosses 28 provided for the support of carrier substrate 100 during the encapsulation process.

As can be seen in drawing FIG. 7, the sawing, cutting or otherwise separating of individual board-on-chip packages 120 most preferably includes sawing through a centermost portion of one or more of the pockets or indentations 104 aligned with individual package 120 edges to minimize the impact of pockets or indentations 104 on the integrity of the encapsulated package. A vision system, such as a digital or pattern recognition system, can be used to recognize the pockets or indentations 104 and align a singulation saw along imaginary lines running between two or more pockets or indentations 104. In another aspect of the invention, saw fiducials (not shown) may be previously provided on the upper surface of carrier substrate 100 in areas peripheral to each BGA 105. Saw fiducial marks can be placed on either side of carrier substrate 100 to align, or aid in alignment of, the singulation saw, whereby carrier substrate 100 can be segmented or defined into a plurality of individual packages 120.

Still referring to drawing FIG. 7, prior to or after singulation, the encapsulated die side area 113 of individual packages 120 may be lasermarked, or marked by other means, with identifying information for purposes of corporate identity, product differentiation and counterfeit protection. The encapsulated die side area 113 may also be marked with features which are useful for individual package 120 in subsequent processing or applications. As such, fiducials or a pin one indicator 121 may be marked onto a surface portion of encapsulated die side area 113 of an individual package 120.

Once singulation and other initial processing have been completed, individual package 120 may be connected by its BGA to, e.g., a circuit board, a second BGA semiconductor package, a stack of BGA semiconductor packages, or a multi-chip module board (such as a memory module), with matching or complementary connective elements. Thus, the methods of the present invention can be used to provide one or more individual packages 120 for incorporation in a semiconductor device assembly and to form components used in the construction of a computer system.

It will be appreciated by those skilled in the art that, while illustrating certain embodiments, the embodiments herein described are not intended to so limit the invention or the scope of the appended claims. Those skilled in the art will also understand that various combinations or modifications of the preferred embodiments could be made without departing from the scope of the invention.

For example, it is understood that while the mold apparatus of the present invention has been described in relation to the encapsulation of a board-on-chip array, one of skill in the art will recognize that many variations of the above-described apparatus are apparent and further applicable to multi-chip array arrangements in which one or more relatively large surface areas of a substrate, which may or may not contain one or more devices or other components, are to be encapsulated. As one example, a substrate array comprising a plurality of flip-chips associated with a surrounding BGA for external electrical interconnection can be encapsulated by a related mold embodiment. Such a mold embodiment can have a first mold half including individual molded body cavities for molding the plurality of flip-chips and preventing the flow of encapsulant onto the BGA, and a second opposing mold half comprising a large cavity for encapsulating all or a large area of the underside of the carrier substrate, which can contain IC chips and/or other devices such as resistors, capacitors, etc., or no devices at all. To prevent or restrain the substrate from deflecting from the forces of gravity, the flow of encapsulant, etc., standoff pins or bosses 28, as previously described, are provided in the large cavity of the second opposing mold half to contact selected areas on the underside of the substrate upon closing the mold, or upon a predetermined degree of deflection in the substrate during molding.

As a second example, a carrier substrate array may comprise a tape lead frame, the tape lead frame configured with an array of die attach paddles (as the die attach area) and leads for interconnection with a plurality of semiconductor dice. With reference to drawing FIG. 8, conventional lead frames for chip scale, LOC or other various lead frame packages are typically formed from a single, continuous sheet of metal, such as copper or a copper alloy, using a metal stamping operation. Lead frames may be manufactured as arrays (hereinafter referred to as "lead frame arrays"), the lead frame arrays having dimensions wide enough to accommodate a various number of semiconductor chips across a lead frame width. The lead frame arrays are generally formed with carrier rails and guide holes for positioning the lead frame array during automated manufacturing. Each of the lead frames may include a plurality of internal and external leads, tie bars, and the die-attach paddle. The lead frames may vary in their sizes dependent upon the size of the semiconductor dice to be attached thereto and the number of electrical connections required to be made to the semiconductor dice.

Figure 8:
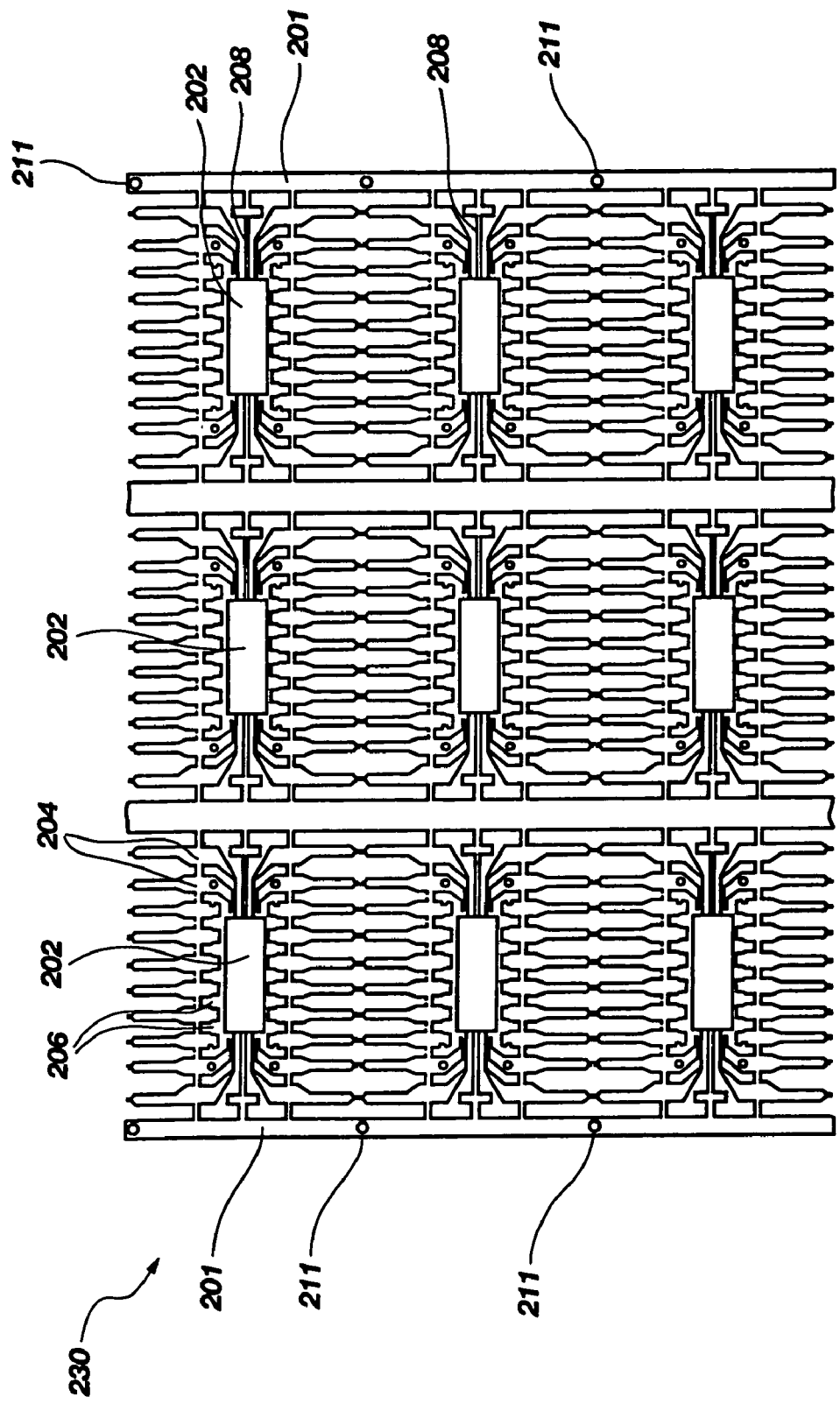
FIG. 8 is an exemplary lead frame carrier substrate array for use with the methods of the present invention.

As shown by drawing FIG. 8, a lead frame array 230 suitable for use in the method of the present invention includes a plurality of central semiconductor device supporting pads (die paddles) 202 arranged across a width of a lead frame. Semiconductor chips (not shown) are mounted to a first surface of the lead frame array 230 on die paddles 202. Each die paddle 202 of the lead frame array 230 is located adjacent a plurality of lead fingers 204, each lead finger 204 having, in turn, a terminal bonding portion 206 near the die paddle on which the semiconductor die is to be located (for establishing electrical communication with the semiconductor die). Tie bars 208 are provided for support of die paddle 202, and a pair of parallel side rails 201 supports tie bars 208. Parallel side rails 201 will typically include guide holes 211 for positioning the lead frame array during automated manufacturing, and which may also be used with complementary features of a mold platen to properly seat the lead frame array 230 in the mold. The lead frame array 230 also includes a second surface that may or may not comprise additional semiconductor dice, electrical interconnections, and/or circuitry.

Figure 9:
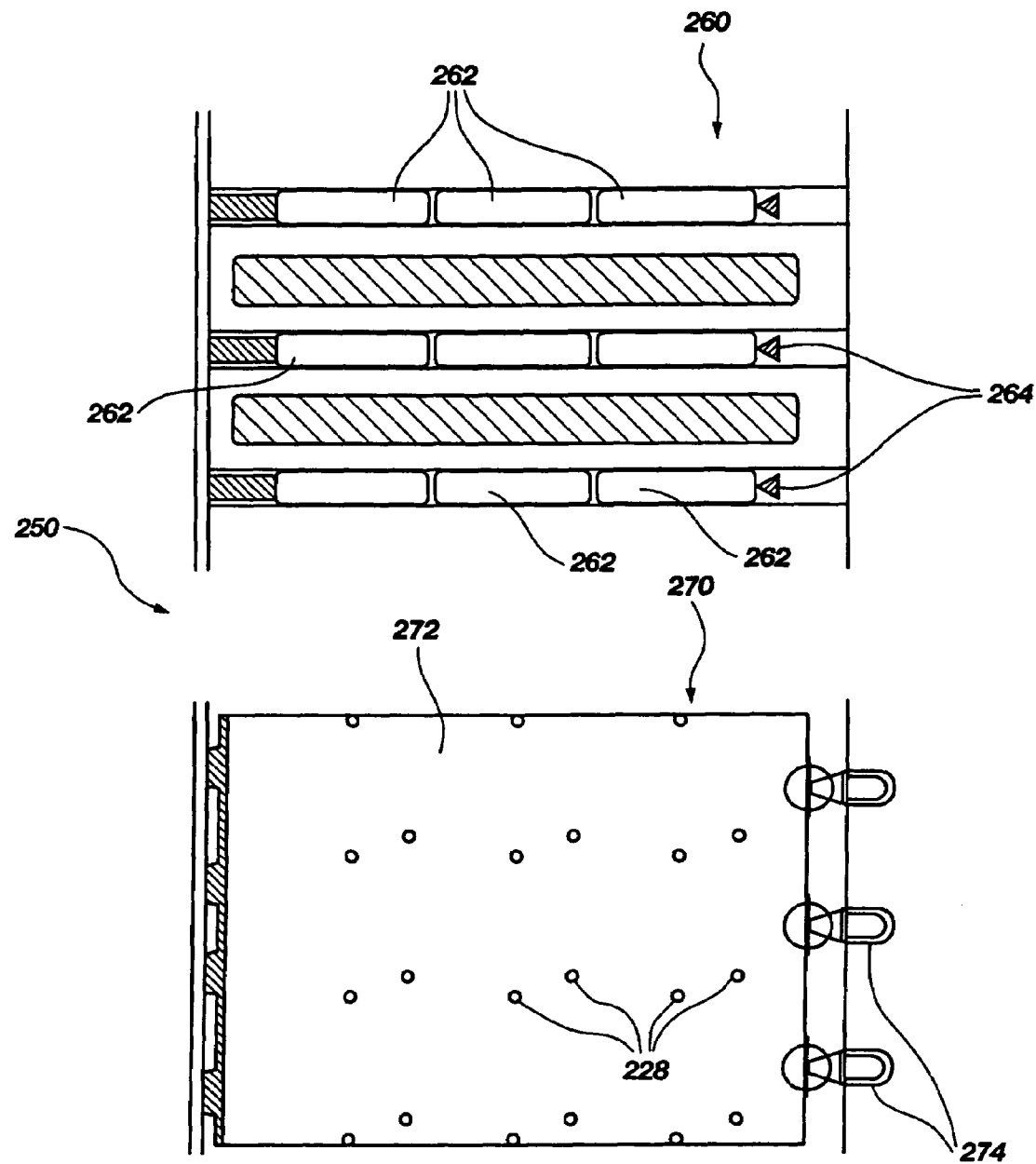
FIG. 9 illustrates a mold assembly for encapsulating a lead frame carrier substrate array in accordance with the methods of the present invention.

Illustrated in drawing FIG. 9 is a mold assembly embodiment 250 for encapsulating lead frame array 230. In drawing FIG. 9, a first mold platen 260 is configured with a plurality of first mold cavities 262 suitable for encapsulating semiconductor dice mounted on die paddles 202. Similar to the embodiment of mold apparatus 50 for encapsulating a board-on-chip array 30 (see drawing FIG. 4), the second mold platen 270 of mold assembly 250 is configured with an open second mold cavity 272, second mold cavity 272 being large enough to ensure coverage, by encapsulant, of all or most of the entire second surface of the lead frame array 230, to include any semiconductor dice, electrical interconnections, and/or circuitry elements mounted thereon. Standoff pins or bosses 228 as previously described are provided in the second mold cavity 272 to prevent or minimize deflection of the lead frame. All other aspects of the mold assembly 250 and carrier substrate processing are similar to the mold apparatus 50 previously described, and include gates 264 and 274 and the methods provided for singulation of individual packages.

Thus, while certain representative embodiments and details have been shown for purposes of illustrating the invention, it will be apparent to those skilled in the art that various changes in the invention as disclosed herein may be made without departing from the scope of the invention, which is defined in the appended claims.

What is claimed is:

1. A mold assembly for encapsulating a semiconductor substrate array, comprising:
    a first mold platen having a plurality of first mold cavities, each first mold cavity of the plurality of first mold cavities suitable for encapsulating substrate/semiconductor die interconnections and portions of a first surface of the semiconductor substrate array;
    a second mold platen having a second mold cavity suitable for encapsulating substantially an entire second surface of the semiconductor substrate array; and
    a plurality of support elements in the second mold cavity for controlling deflection of the semiconductor substrate array towards the second mold cavity.

2. The mold assembly of claim 1, wherein at least one of the plurality of support elements includes a machined support element.

3. The mold assembly of claim 1, wherein at least one of the plurality of support elements includes a cast support element.

4. The mold assembly of claim 1, wherein at least some of the plurality of support elements comprise:
    an elongated portion extending into the second mold cavity from an inner surface thereof.

5. The mold assembly of claim 4, wherein the at least some of the plurality of support elements include a taper on the elongated portion thereof.

6. The mold assembly of claim 1, wherein at least some of the plurality of support elements are connected to an inner surface of the second mold cavity.

7. The mold assembly of claim 6, wherein the at least some of the plurality of support elements connected to an inner surface of the second mold cavity include resiliently mounted support elements.

8. The mold assembly of claim 6, wherein the at least some of the plurality of support elements connected to an inner surface of the second mold cavity have portions thereof engaging portions of holes in the second mold cavity and wherein the at least some of the plurality of support elements include support elements secured in at least some of the holes by one of welding, brazing, and soldering.

9. The mold assembly of claim 1, wherein the plurality of support elements includes removable support elements.

10. The mold assembly of claim 9, wherein at least some of the plurality of support elements include interlinked support elements.

11. The mold assembly of claim 9, wherein at least some of the plurality of support elements include support elements comprised of a polymer.

12. The mold assembly of claim 9, wherein at least some of the plurality of support elements extend inwardly from a surface of the second mold cavity and have adjacent end portions anchoring the at least some of the plurality of support elements.

13. A mold assembly for encapsulating an array of die attach areas on a carrier substrate, comprising:
    a first mold platen having a plurality of first mold cavities, each of a size configured to encompass a single die attach area of the array of die attach areas;
    a second mold platen having a second mold cavity of a size sufficient to encompass a plurality of die attach areas of the array of die attach areas; and
    a plurality of support elements in the second mold cavity located and configured to reduce deflection of the carrier substrate towards the second mold cavity.

14. The mold assembly of claim 13, wherein at least some of the plurality of support elements are aligned within the second mold cavity along lines representing support areas on the carrier substrate intermediate the die attach areas.

15. The mold assembly of claim 13, wherein the plurality of support elements includes removable support elements.

16. The mold assembly of claim 15, wherein at least some of the plurality of support elements include interlinked support elements.

17. The mold assembly of claim 16, wherein the interlinked support elements are protrusions interlinked by thin strands of a resilient material resting on a bottom surface area of the second mold cavity.

18. The mold assembly of claim 16, wherein the interlinked support elements are protrusions extending from a thin sheet of resilient material resting on a bottom surface area of the second mold cavity.

19. The mold assembly of claim 15, wherein at least some of the plurality of support elements comprise:
    an elongated portion extending inwardly from a surface of the second mold cavity; and
    a tip portion of a radius larger than the elongated portion.

20. The mold assembly of claim 13, wherein at least some of the plurality of support elements include support elements comprised of a polymer or epoxy resin.

21. The mold assembly of claim 13, wherein the plurality of support elements are resiliently mounted within the second mold cavity.

22. A mold assembly for encapsulating a plurality of electronic devices on a carrier substrate, comprising:
    a first mold platen having a plurality of first mold cavities for encapsulating a first side portion of the carrier substrate, each first mold cavity of the plurality of first mold cavities associated with an electronic device of the plurality of electronic devices;
    a second mold platen having a second mold cavity for encapsulating an area of a second side portion of the carrier substrate corresponding to the plurality of first mold cavities; and
    at least one support element in the second mold cavity comprised of a polymer or epoxy resin and located and configured to reduce deflection of the carrier substrate towards the second mold cavity.

23. The mold assembly of claim 22, wherein the at least one support element is a removable support element.

24. The mold assembly of claim 23, wherein the at least one support element is a plurality of interlinked support elements.

25. The mold assembly of claim 24, wherein the plurality of interlinked support elements are protrusions interlinked by thin strands of a resilient material resting on a bottom surface area of the second mold cavity.

26. The mold assembly of claim 24, wherein the plurality of interlinked support elements are protrusions extending from a thin sheet of resilient material resting on a bottom surface area of the second mold cavity.

27. The mold assembly of claim 23, wherein the at least one support element comprises:
    an elongated portion extending outwardly from the second mold cavity; and
    a tip portion of a radius larger that the elongated portion.

* * * * *

UNITED STATES PATENT AND TRADEMARK OFFICE
CERTIFICATE OF CORRECTION

PATENT NO. : 7,156,633 B2 Page 1 of 1
APPLICATION NO. : 11/121221
DATED : January 2, 2007
INVENTOR(S) : Todd O. Bolken and David L. Peters It is certified that error appears in the above-identified patent and that said Letters Patent is hereby corrected as shown below:

COLUMN 18, LINE 48, change "larger that the" to --larger than the--

Signed and Sealed this

Nineteenth Day of June, 2007

JON W. DUDAS
*Director of the United States Patent and Trademark Office*